(12) United States Patent
Kim

(10) Patent No.: US 8,912,506 B2
(45) Date of Patent: Dec. 16, 2014

(54) DEVICE FOR SUSTAINING DIFFERENTIAL VACUUM DEGREES FOR ELECTRON COLUMN

(75) Inventor: Ho Seob Kim, Chonan-si (KR)

(73) Assignee: CEBT Co., Ltd., Tangjeong-myeon, Asan-si, Chungcheongnam-do (KR)

( * ) Notice: Subject to any disclaimer, the term of this patent is extended or adjusted under 35 U.S.C. 154(b) by 908 days.

(21) Appl. No.: 12/278,219

(22) PCT Filed: Feb. 2, 2007

(86) PCT No.: PCT/KR2007/000584
§ 371 (c)(1),
(2), (4) Date: Feb. 2, 2009

(87) PCT Pub. No.: WO2007/089124
PCT Pub. Date: Aug. 9, 2007

(65) Prior Publication Data
US 2009/0224650 A1    Sep. 10, 2009

(30) Foreign Application Priority Data
Feb. 2, 2006 (KR) .................. 10-2006-0009881

(51) Int. Cl.
*G01F 23/00* (2006.01)
*H01J 37/18* (2006.01)

(52) U.S. Cl.
CPC ......... *H01J 37/18* (2013.01); *H01J 2237/1205* (2013.01); *H01J 2237/188* (2013.01)
USPC .................................................. 250/441.11

(58) Field of Classification Search
USPC .............. 250/306, 307, 311, 440.11, 441.11, 250/492.1, 492.3
See application file for complete search history.

(56) References Cited

U.S. PATENT DOCUMENTS

| 4,590,792 A * | 5/1986 | Chiang .................... 73/28.06 |
| 4,992,662 A * | 2/1991 | Danilatos ................... 850/9 |

(Continued)

FOREIGN PATENT DOCUMENTS

| JP | 1983-024953 | 2/1983 |
| JP | 1993-234552 | 9/1993 |

(Continued)

OTHER PUBLICATIONS

Hansen, Stephen P., the Bell Jar, 1999, p. 3-80.*

*Primary Examiner* — Nicole Ippolito
*Assistant Examiner* — Jason McCormack
(74) *Attorney, Agent, or Firm* — John K. Park; Park Law Firm

(57) ABSTRACT

Disclosed is a device for sustaining different vacuum degrees for an electron column, including an electron emitter, a lens part, and a housing for securing them, to maintain the electron column and a sample under different vacuum degrees. The device comprises a column housing coupling part coupled to the housing to isolate a vacuum; a hollow part defined through the center portion of the device to allow an electron beam emitted from the electron column to pass therethrough; and a vacuum isolation part having a structure of a gasket for vacuum coupling, wherein a difference of no less than 10 torr in a vacuum degree is maintained between both sides of the device by selecting an appropriate diameter of a lens electrode layer which is finally positioned in a path along which the electron beam is emitted or by using the hollow part.

20 Claims, 5 Drawing Sheets

(56) References Cited

U.S. PATENT DOCUMENTS

| | | | |
|---|---|---|---|
| 5,016,920 A * | 5/1991 | Anderson | 285/39 |
| 5,396,067 A | 3/1995 | Suzuki et al. | |
| 5,442,183 A * | 8/1995 | Matsui et al. | 250/441.11 |
| 5,530,255 A * | 6/1996 | Lyons et al. | 250/492.3 |
| 5,671,956 A * | 9/1997 | Crawford | 285/328 |
| 5,811,803 A | 9/1998 | Komatsu et al. | |
| 6,031,235 A * | 2/2000 | Ishida et al. | 250/441.11 |
| 6,365,898 B1 * | 4/2002 | Sudraud et al. | 250/310 |
| 6,414,307 B1 * | 7/2002 | Gerlach et al. | 850/43 |
| 7,285,780 B2 * | 10/2007 | Jaksch et al. | 250/310 |
| 2001/0040215 A1 * | 11/2001 | Ahmed et al. | 250/307 |
| 2002/0113438 A1 * | 8/2002 | Lynn et al. | 285/354 |
| 2002/0124695 A1 * | 9/2002 | Seger | 82/158 |
| 2002/0166976 A1 * | 11/2002 | Sugaya et al. | 250/440.11 |
| 2003/0197134 A1 * | 10/2003 | Kurihara et al. | 250/492.22 |
| 2004/0046120 A1 * | 3/2004 | Moses et al. | 250/311 |
| 2004/0173747 A1 * | 9/2004 | Dean et al. | 250/310 |
| 2005/0173632 A1 * | 8/2005 | Behar et al. | 250/311 |
| 2006/0249688 A1 * | 11/2006 | Chao et al. | 250/441.11 |

FOREIGN PATENT DOCUMENTS

| | | |
|---|---|---|
| JP | 1994-060841 | 3/1994 |
| JP | 1997-063525 | 3/1997 |
| JP | 1999-273604 | 10/1999 |
| JP | 2000-133181 | 5/2000 |
| JP | 2001-084948 | 3/2001 |
| JP | 2003-234080 | 8/2003 |

* cited by examiner

9-A

9-B

DEVICE FOR SUSTAINING DIFFERENTIAL VACUUM DEGREES FOR ELECTRON COLUMN

TECHNICAL FIELD

The present invention relates to a device for sustaining different vacuum degrees for an electron column, and more particularly, to a device for sustaining different vacuum degrees for an electron column, which maintains the vacuum degree of a chamber in which an electron column is used and the vacuum degree of a chamber in which a sample is placed different from each other.

BACKGROUND ART

As is generally known in the art, an electron column is used to generate an electron beam by emitting electrons. A microcolumn is a very small electron column constructed by miniaturizing an electron column, which uses a principle of controlling an electron beam conventionally employed in a CRT, in an electron microscope, for electron beam lithography, and in various electron beam apparatuses.

FIG. 1 illustrates the structure of a microcolumn 100 as a typical very small electron column. The microcolumn 100 includes, as its basic component parts, an electron emitter 110, a source lens 140, deflectors 160, and a focus lens 170.

An electron emitter holder 120 is defined with a through-hole 121 in the center portion thereof, and the electron emitter 110 is inserted into the through-hole 121. The electron emitter holder 120 having the electron emitter 110 inserted therein is concentrically coupled to a holder base 130.

The source lens 140 is coupled to the lower surface 131 of the holder base 130. The source lens 140 can be directly coupled to the lower surface 131 of the holder base 130 by bonding, etc. The holder base 130, having the source lens 140 coupled thereto, is inserted into a column base 150.

The column base 150 has a hollow cylindrical configuration and includes an end portion 151 which has a through-hole (not shown) defined in a center portion thereof so that the electron beam emitted from the electron emitter can pass through the through-hole. The column base 150 has a space in which the holder base 130 is received and coupled to. A plurality of through-holes are radially arranged and formed through the column base 150, and the deflectors 160 are inserted through the through-holes. The focus lens 170 is coupled to the lower end of the end portion 151 of the column base 150 by bonding, etc. Therefore, the vertical position of the focus lens 170 can be determined by the position of the end portion 151.

Generally, in an electron column, in order to allow the electron emitter to stably emit electrons, it is necessary to maintain a high vacuum. A microcolumn, as a typical electron column, must be employed in an ultra high vacuum of about $10^{-9}$ Torr due to the characteristics of the electron emitter. The ultra high vacuum is created by using an ion pump or a getter pump. In order to quickly create the ultra high vacuum, bakeout must be conducted.

However, the electron beam generated by the electron column can be sufficiently utilized even in a vacuum of about $10^{-3}$ Torr, which is not an ultra high vacuum. That is to say, when the electron beam generated by the electron column is incident on a sample, the chamber or space in which the sample is placed need not be maintained in an ultra high vacuum state, and it is sufficient to maintain the chamber or space in a (normal) vacuum state.

In this regard, if the electron column and the sample are employed in an ultra high vacuum, it takes a long time to change a sample, and the cost of manufacturing the chamber to form the ultra high vacuum increases. That is to say, it is not preferable to maintain the chamber, in which the sample is placed to allow the electron beam emitted from the electron column to be incident thereon, in an ultra high vacuum state, because substantial costs are incurred.

Therefore, when using the electron column, it is necessary to separate the chamber in which the electron column is used and the chamber in which the sample is placed, and to maintain different pressures in the two chambers.

DISCLOSURE OF INVENTION

Technical Problem

Accordingly, the present invention has been made in an effort to solve the problems occurring in the related art, and an object of the present invention is to provide a device for sustaining different vacuum degrees for an electron column, in which a chamber for an electron column for generating an electron beam and a chamber for placing a sample are separated from each other, and maintains different vacuum degrees in the two chambers.

Another object of the present invention is to provide a chamber system which has a simple structure to allow an electron column to be in a different ultra high vacuum degree.

Technical Solution

In order to achieve the above object, according to one aspect of the present invention, there is provided a device for sustaining different vacuum degrees for an electron column, including an electron emitter, a lens part, and a housing for securing them, to maintain the electron column and a sample under different vacuum degrees, the device comprising a column housing coupling part coupled to the housing to isolate the vacuum; a hollow part defined through the center portion of the device to allow an electron beam emitted from the electron column to pass therethrough; and a vacuum isolation part having a structure of a gasket for vacuum coupling, wherein a difference of no less than $10^1$ torr in a vacuum degree is maintained between upper and lower sides of the device by selecting an appropriate diameter of a lens electrode layer, which is finally positioned in a path along which the electron beam is emitted, or by using the hollow part.

In order to solve the above-described problems of the conventional art, the present invention is directed to a device for sustaining different vacuum degrees for an electron column, which has a simple construction and can allow a difference of no less than $10^1$~$10^4$ torr in a vacuum degree to be maintained between a chamber in which an electron column is used and a chamber in which a sample is accommodated.

In the electron column, a focus lens is generally used as the last bottom lens through which an electron beam passes finally. The characterizing feature of the present invention resides in that an aperture defined through the focus lens or the final electrode layer of the focus lens serves as a sole passage of a final electron column housing assembly. That is to say, the sole passage between the chamber in which the electron column is accommodated and the chamber in which the sample is accommodated become the aperture of the electron lens of the electron column.

If it is difficult to form the passage using the aperture of the lens due to the provision of space for wiring in the housing of the electron column, the hollow part (a through-hole) of the device for sustaining different vacuum degrees for an electron column according to the present invention can be formed like an electrode layer of an electron lens and can be used in a state in which it is as close as possible to the electron column. In this case, it is preferred that the hollow part have a thin and small-sized hole such as that defined through a membrane, so that it can be as close to the electron column as possible.

As the chamber for an ultra high vacuum, in which the electron column is accommodated, vacuum components, such as circular or hexahedral cubic, six way crosses, various way crosses, and the like can be used. When chambers are coupled with one another and a pump or other parts for ultra high vacuum are coupled to the chamber, it is normal to use a gasket having the shape of a hollow disc, etc. The gasket is made of metal and is different from a rubber ring which is used for the purpose of sealing a chamber for high or low vacuum applications. As the material of the gasket, metal, which does not produce gas under a UHV condition, is mainly used.

The device for sustaining different vacuum degrees for an electron column according to the present invention includes the function (configuration) of the conventional gasket because it has the characteristics of such a gasket. The device according to the present invention can be realized as an integrated type, in which the device is integrally coupled with the component parts of the electron column, and a separated type, in which the device is separately coupled to a column housing. In other words, the device for sustaining different vacuum degrees for an electron column according to the present invention performs the function of a gasket, and at the same time, is coupled to the electron column such that only the hole or aperture of the electron lens of the electron column can be present as a passage and each of desired vacuum degrees can be created and maintained using vacuum pumps. In order to maintain different vacuum degrees between both chambers, vacuum conditions must be created and maintained using vacuum pumps which have capacities conforming to the respective desired vacuum degrees and the sizes of the chambers. In this connection, it is preferred that the passage between the two chambers be as small as possible. In case a separate small hole is defined between the chambers to maintain different vacuum conditions as described above, the passage for an electron beam could be adversely influenced by the separate small hole. Therefore, it is preferred that only the aperture of the lens be used as it is.

In the case where the final component part of the electron column is wire type deflectors, the deflector holes defined through a column base can be used based on the same concept as the aperture of the lens. As the case may be, if a source lens is used as the final component part through which the electron beam finally passes in an electron column, in the present invention, the source lens can be used in the same manner in which the focus lens is used as described above.

Further, where the chamber in which the electron column is accommodated is not separately coupled with the sample chamber, but is inserted into the sample chamber, in the device for sustaining different vacuum degrees for an electron column according to the present invention, an O-ring can be placed on the portion of the device which performs the function of the gasket, whereby it is possible to sufficiently induce different vacuum degrees using the device of the present invention.

Advantageous Effects

Thanks to the above features, the device for sustaining different vacuum degrees for an electron column according to the present invention provides advantages in that an ultra high vacuum (UHV) for allowing electrons to be easily emitted from the electron emitter of an electron column can be formed in a minimal space, and the vacuum degree for electron column which is different from the vacuum degree for a sample on which an electron beam is incident can be easily realized. As a consequence, the cost and time required for the manufacture and maintenance of the equipment using the electron column can be reduced.

Also, since a bake-out time can not be required in addition to reducing the cost incurred to form the ultra high vacuum, when changing a sample, the time and the cost can be further saved. In particular, in terms of time, it is possible to quickly change or replace a sample in a short time. Further, the costs incurred when using a large-sized ion pump or getter pump and forming a chamber so as to induce an ultra high vacuum in a large space can be significantly saved.

When using an electron column, if it is required to induce a different vacuum degree, the device according to the present invention can be used in a simple and easy manner.

BRIEF DESCRIPTION OF THE DRAWINGS

FIG. 9 illustrates a device for sustaining different vacuum degrees for an electron column in accordance with still another embodiment of the present invention, wherein FIG. 9A is a perspective view and FIG. 9B is a cross-sectional view.

MODE FOR THE INVENTION

Figure 1:
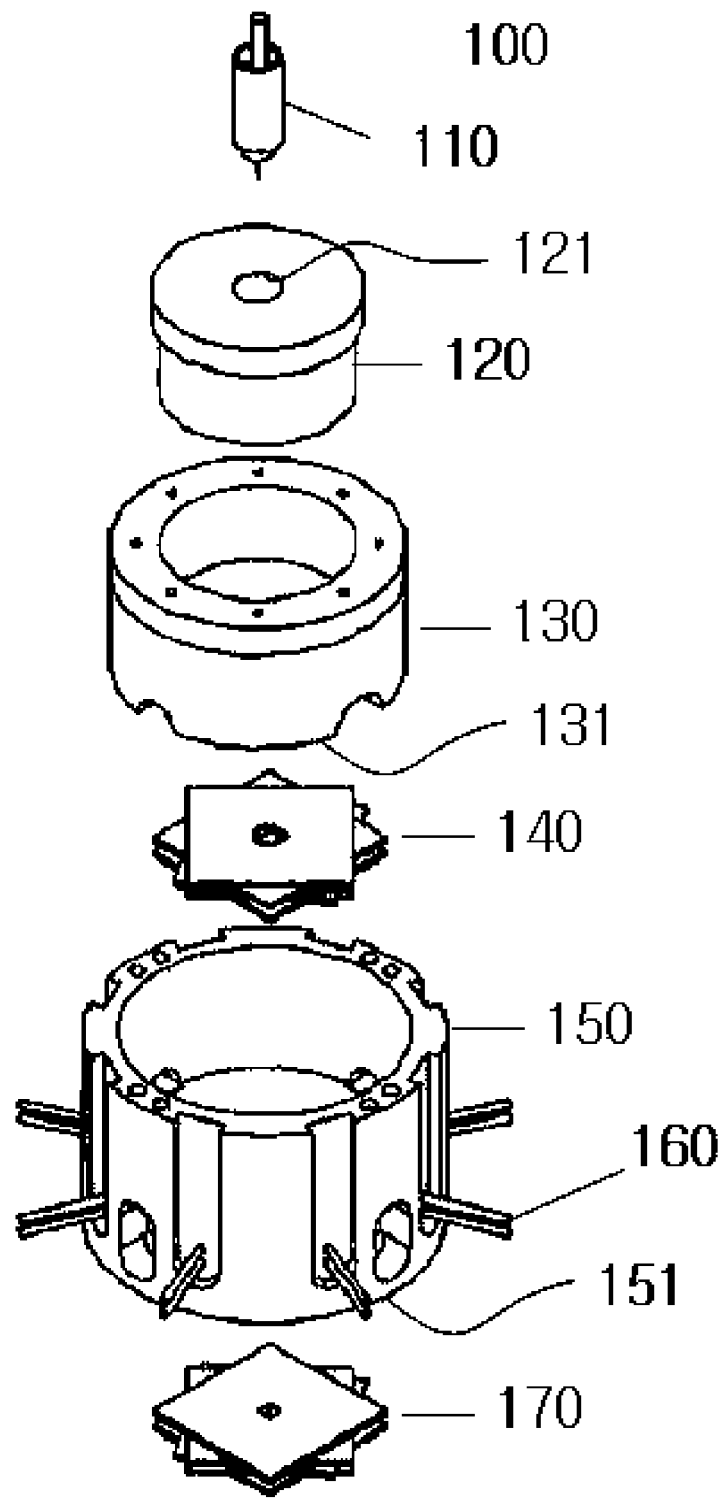
FIG. 1 is an exploded perspective view schematically illustrating the construction of a conventional microcolumn.
Figure 2:
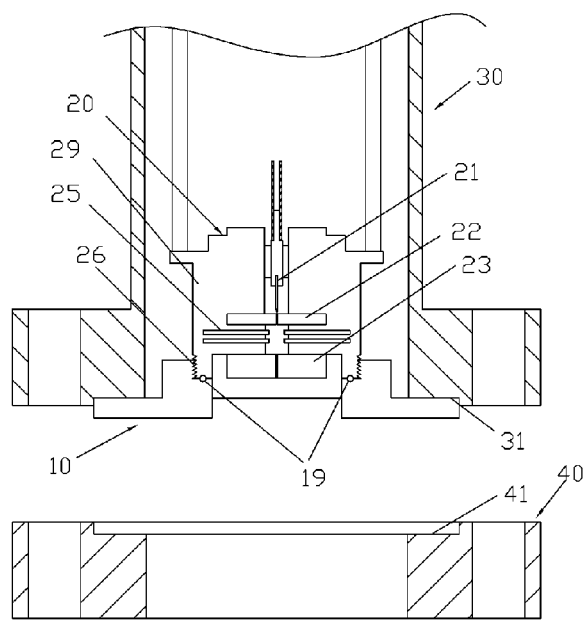
FIG. 2 is a cross-sectional view illustrating an example in which a device for sustaining different vacuum degrees for an electron column in accordance with an embodiment of the present invention is used along with an electron column.
Figure 3:
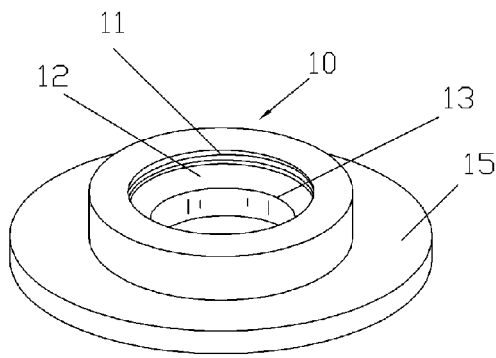
FIG. 3 is a perspective view illustrating the device for sustaining different vacuum degrees for an electron column according to the present invention shown in FIG. 2.

Reference will now be made in greater detail to a preferred embodiment of the invention, an example of which is illustrated in the accompanying drawings. First, one embodiment of the present invention will be described with reference to FIGS. 2 and 3. FIG. 2 illustrates a state in which a device 10 for sustaining different vacuum degrees for an electron column in accordance with an embodiment of the present invention is used in a state in which it is coupled to the housing of an electron column in a 4-way~6-way crosses or a cubic chamber, etc. serving as a chamber 30 for an electron column 20. A column housing 29, in and to which an electron emitter 21, lens parts 22 and 23, deflectors 25, and so forth are inserted and coupled as component parts of the electron column, and the device 10 for sustaining different vacuum degrees according to the present invention, are coupled with each other, and the resultant structure is received in the gasket accommodation part 31 of the chamber 30 for the electron column. The device 10 is coupled to the gasket accommodation part 41 of the lower flange 40 or a sample chamber to perform a vacuum isolation function. In the present embodiment, as shown in FIG. 3, the device 10 for sustaining different vacuum degrees includes a column housing coupling part 11 which has formed therein internal threads to be engaged with the housing, a sealing surface 12 which is brought into contact with the lower surface of the housing or isolates or closes a vacuum using an O-ring, a hollow part 13 through which an electron beam passes, and a vacuum isolation part 15 which performs the function of a gasket to enable the vacuum to be isolated. The hollow part 13 is defined so that it does not adversely influence the passage through which the electron beam from the electron column passes. That is to say, due to the fact that the column housing coupling part 11 of the device 10 of the present invention, which is formed with the internal threads, is locked to the threaded part 26, which is formed in the outer surface of the lower end portion of the housing 29, the device 10 is coupled to the housing 29. In the present embodiment, in order to isolate the vacuum between the sealing surface 12 and the lower surface of the housing 29, the O-ring 19 is used. In the present embodiment, while the device 10 for sustaining different vacuum degrees and the housing 29 are coupled with each other through a threaded engagement between the threads 11 and 26 and/or through the medium of the O-ring, it is to be readily understood that they can be coupled with each other by various other means, such as bolts, screws, or fitting. Namely, the device 10 for sustaining different vacuum degrees performs the function of a gasket to be used for coupling a flange, a cube, and/or chambers, and is coupled to the electron column housing to isolate the vacuum inside the housing. a final lens is coupled to the housing 29 through bonding, etc., so that the space inside an electron column can be closed in the direction in which the electron beam passes, except for the aperture of the last lens layer. Therefore, the device 10 for sustaining different vacuum degrees according to the present invention is constructed in a manner such that it is coupled to the electron column housing so that the electron column chamber, in which the electron column is accommodated, and the sample chamber, containing the sample on which the electron beam is incident, can be vacuum-isolated from each other, except for the aperture of the final lens. To this end, when the lower surface and/or the side surface of the electron column housing and the device 10 for sustaining different vacuum degrees are coupled to each other, the electron column chamber and the sample accommodating chamber are vacuum-isolated, except for the aperture of the final lens or the lens layer received in the housing.

Figure 4:
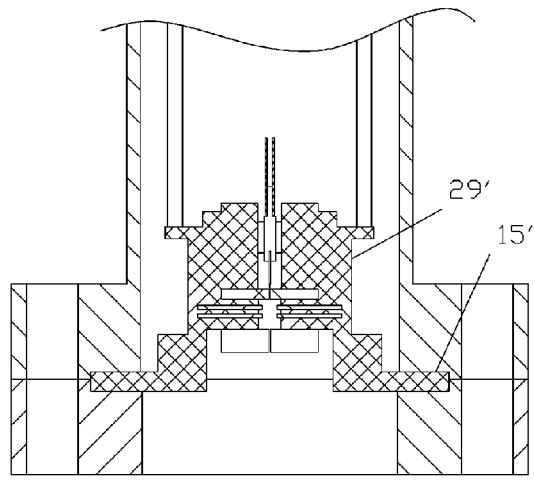
FIG. 4 is a cross-sectional view illustrating another example in which the device for sustaining different vacuum degrees for an electron column according to the present invention is integrally formed with an electron column housing.

FIG. 4 illustrates another embodiment of the present invention, in which the device for sustaining different vacuum degrees is integrally formed with the lower part of the housing. In this embodiment, the column housing coupling part 11 of the device 10 for sustaining different vacuum degrees shown in FIGS. 2 and 3 and the threaded part 26 of the housing 29 are integrally formed with each other, and the sealing surface 12 of the device 10 for sustaining different vacuum degrees and the bottom surface of the housing are integrally formed with each other. The other component parts are used in the same manner as those of the embodiment shown in FIGS. 2 and 3. In other words, the housing 29' shown in FIG. 4 is additionally formed with the portion which corresponds to the device for sustaining different vacuum degrees. The housing 29' has a vacuum closing part 15' which corresponds to the device 10 for sustaining different vacuum degrees, to enable vacuum isolation or vacuum closing between the chambers, whereby different vacuum degrees can be maintained between the two chambers. In this case, preferably, the electron column, in which the assembly of wirings is finished, is coupled, in a socket type manner, to a feedthrough for outside wiring.

Figure 5:
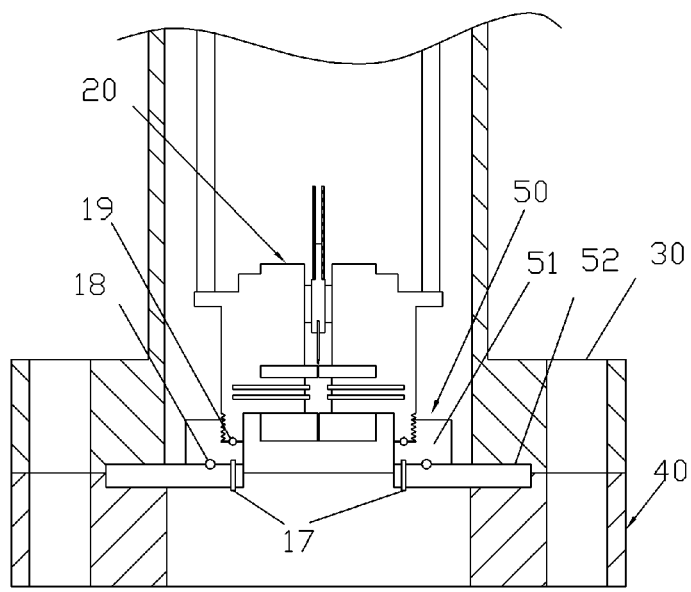
FIG. 5 is a cross-sectional view illustrating another example in which a separated type device for sustaining different vacuum degrees for an electron column according to the present invention is used along with an electron column.

In FIG. 5, unlike the embodiment shown in FIG. 4, a device 50 for sustaining different vacuum degrees has two separate sections, so that the wiring or assembly of lenses can be conveniently conducted, in case the size of a micro electron column is small. That is to say, the device for sustaining different vacuum degrees is divided into a column assembly part 51 and a vacuum closing part 52. In the present embodiment, the column assembly part 51 is assembled in advance to the column housing 20 and is inserted into a column chamber 30 in a state in which it is integrally assembled with the column and the wiring on the upper part of the chamber, and the vacuum closing part 52 is positioned in the gasket insertion portion of the flange. Thereupon, the column assembly part 51 and the vacuum closing part 52 are coupled with each other using the O-ring 18 or threads 17. Of course, it is possible for the column assembly part 51 and the vacuum closing part 52 to be directly coupled with each other through a threaded engagement, as in the case of the column housing 29 and the column assembly part 51, in which case the O-ring can be used to ensure reliable vacuum isolation.

Figure 6:
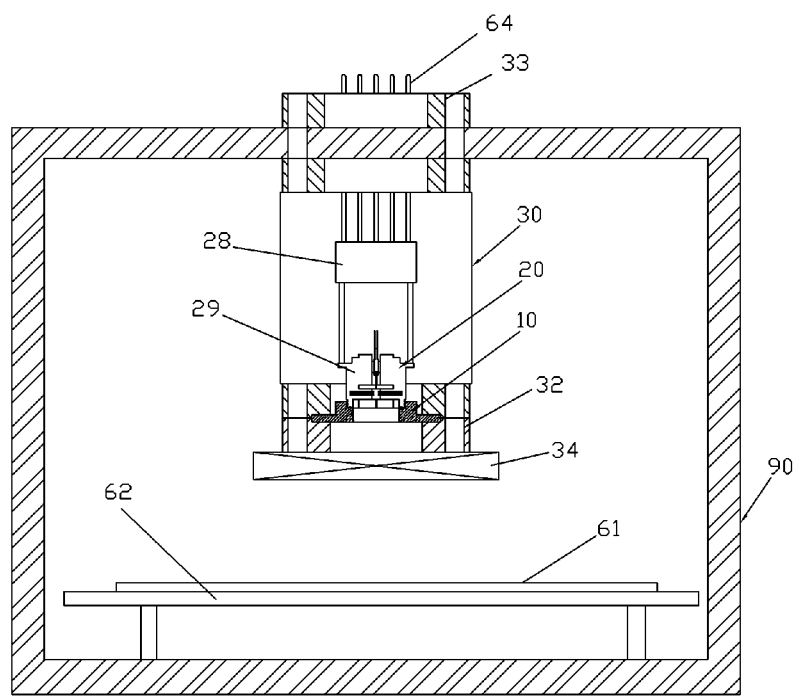
FIG. 6 is a cross-sectional view illustrating a state in which an electron column and the device for sustaining different vacuum degrees for an electron column according to the present invention are installed in a chamber.

FIG. 6 is a cross-sectional view illustrating a state in which the device 10 for sustaining different vacuum degrees according to the present invention is coupled to the housing 29 of the assembled electron column 20, and the resultant structure is installed in the electron column chamber 30. Unlike other embodiments, in the present embodiment, the column chamber 30 is coupled into a sample chamber 90 into which a sample is inserted, using a flange 33. The sample chamber 90 may have a vacuum degree of about $10^{-5}$~$10^{-7}$ torr, which is about $10^1$~$10^3$ torr lower than the column chamber 30. A gate valve 34 is installed under a flange 32 such that the vacuum of the electron column chamber 30 can be continuously maintained even when changing the electron column or the sample 61 placed on a stage 62. Also, the electron column 20 is connected to an outside controller (not shown) by a feedthrough 64, and is coupled to the feedthrough by a connector 28.

With the device 10 for sustaining different vacuum degrees according to the present invention coupled to the column housing 29 by the flange 32, the column chamber 30 is maintained so that it has a vacuum degree which is different from that of the sample chamber 90, and is secured to the sample chamber 90 by the flange 33. While not shown in the drawing, the respective chambers 30 and 90 may employ respective pumps depending upon desired vacuum degrees, or can be connected to outside pumps to maintain their respective vacuum degrees.

While the integrated type device 10 for sustaining different vacuum degrees as shown in FIG. 2 is used in the drawing, by using the separate type device as shown in FIG. 5, the column assembly can be more easily inserted into the chamber, and the column chamber and the sample chamber or other component parts can be more easily assembled.

Figure 7:
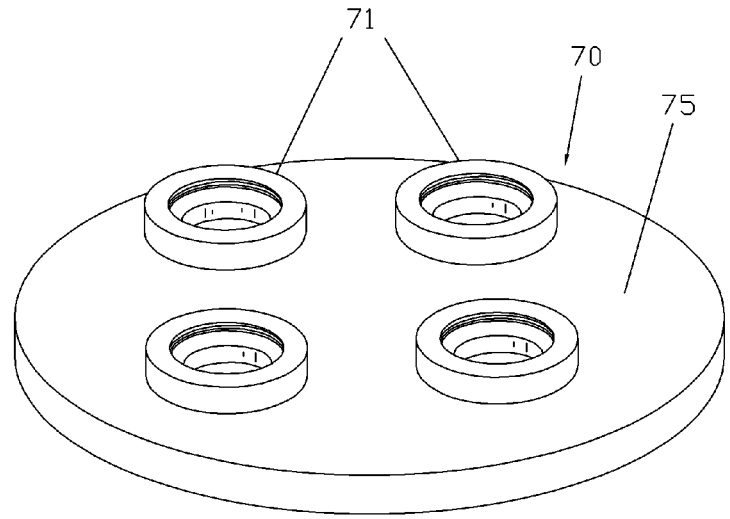
FIG. 7 is a perspective view illustrating a device for sustaining different vacuum degrees for an electron column in accordance with another embodiment of the present invention, which can be coupled with a plurality of electron columns.
Figure 8:
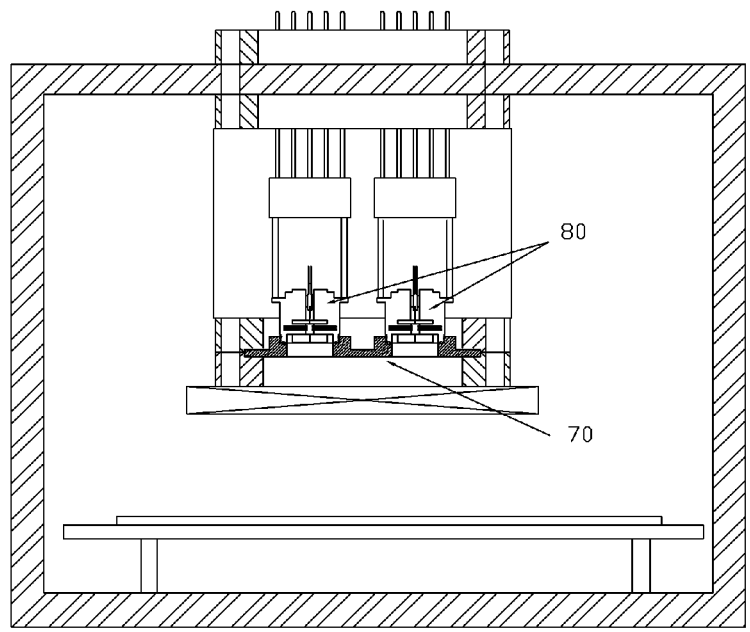
FIG. 8 is a cross-sectional view illustrating another state in which the device for sustaining different vacuum degrees for an electron column shown in FIG. 7 is mounted along with the plurality of electron columns in a chamber.

FIGS. 7 and 8 illustrate the state in which the device 70 for sustaining different vacuum degrees according to the present invention is coupled with a plurality of electron columns to realize multiple use thereof.

As shown in FIG. 7, the device 70 for sustaining different vacuum degrees includes one vacuum closing part 75 and a plurality of column housing coupling parts 71. Similar to the device for sustaining different vacuum degrees shown in FIG. 3, the device 70 for sustaining different vacuum degrees according to this embodiment has hollow parts and closing surfaces which correspond to the column housing coupling parts 71, such that, as shown in FIG. 8, the single device 70 for sustaining different vacuum degrees can be coupled with the plurality of electron columns while sustaining different vacuum degrees between chambers.

FIG. 8 is a cross-sectional view illustrating a state in which the device 70 for sustaining different vacuum degrees as shown in FIG. 7 is used while being coupled to a plurality of electron column housings 80. The construction of the electron column housing as shown in FIG. 6 is used for each electron column housing 80 in the same or similar manner in this embodiment. In other words, compared to FIG. 6, a plurality of electron columns is coupled to one device for sustaining different vacuum degrees, and feedthroughs 64 and connectors 28, corresponding in number to the number of electron columns, are employed.

Therefore, the device for sustaining different vacuum degrees according to the present invention can be applied to one electron column as well as to multiple electron columns in a variety of patterns. It is important to note that the different vacuum degrees can be maintained using the vacuum closing part or parts in a simple manner, and that multiplication is enabled when the device is used along with a micro electron column.

Also, the multiplication can be enabled by arranging several respective electron columns, which are separately vacuumized as in the embodiment shown in FIG. 6.

Figure 9:
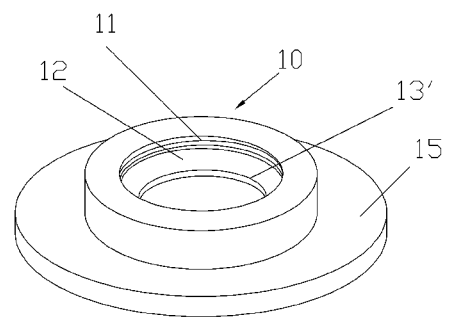
Figure 9:
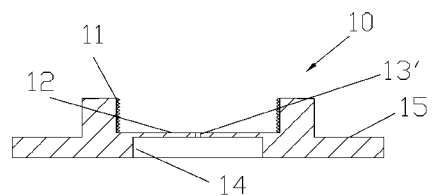

FIG. 9A is a perspective view illustrating a device 10 for sustaining different vacuum degrees in accordance with still another embodiment of the present invention, and FIG. 9B is a cross-sectional view of FIG. 9A. The device 10 according to this embodiment maintains the different vacuum degrees using a hollow part 13'. The device 10 according to this embodiment can be used when a plurality of grooves for wiring is defined in the housing of the electron column, and it is difficult to maintain different vacuum degrees using the aperture of the lens. Hence, in a state in which the diameter of the hollow part 13' is decreased to be as small as possible, the device 10 is coupled to the housing of the electron column, so that the passage of the electron beam is not adversely influenced. It is preferable that the size and the diameter of the hollow part be decreased to be as small as possible, and that the diameter (the size of a groove) be determined depending upon the scanning range of the electron beam emitted from the electron column and the difference in vacuum degree. It is preferred that the diameter be 200 μm, and that the size (thickness) of the hollow part be decreased to the micrometer level to correspond to a membrane.

Since the device 10 for sustaining different vacuum degrees 10 according to the present invention must perform the function of a gasket between the electron column chamber and the sample chamber, the vacuum-closing part 15 must have a pre-determined thickness. Accordingly, in order not to adversely influence the passage of the electron beam, a recess 14 having a greater size than the hollow part 13' is defined below the hollow part 13' to decrease the thickness of the hollow part 13'. Therefore, due to the fact that the device 10 for sustaining different vacuum degrees is directly coupled to the electron column and is defined with the hollow part 13' at the position nearest the electron column, the passage of the electron beam is not obstructed, and the different vacuum degrees can be reliably maintained.

INDUSTRIAL APPLICABILITY

The device for sustaining different vacuum degrees for an electron column according to the present invention can improve vacuum circumstances for miniature electron columns for generating and emitting an electron beam, including micro columns, and can thus be employed in an inspection device, for semiconductor lithography, in an electron microscope, etc.

The invention claimed is:

1. A device for sustaining different vacuum degrees to maintain an electron column and a sample under different vacuum degrees, the device comprising: a chamber comprising a first gasket accommodation part; a column housing coupling part coupled to a column housing contained in the chamber and for securing the electron column with vacuum sealing, wherein the column housing coupling part includes threads provided in an inner surface thereof and configured to be locked to a threaded part formed in the outer surface of the lower end portion of the column housing; a through-hole part defined by a wall surrounding a center portion of the device and surrounded by the column housing coupling part to allow an electron beam emitted from the electron column to pass therethrough; and a vacuum isolation part made of a metal, comprising a metal gasket for vacuum coupling extending perpendicularly from a lower portion of the column housing coupling part and being disposed around the through-hole part in order to allow the electron beam emitted from the electron column to pass through, wherein an upper portion of the metal gasket of the vacuum isolation part is configured to be coupled to the first gasket accommodation part at a lower portion of the chamber column housing and a lower portion of the metal gasket of the vacuum isolation part is configured to be coupled to a second gasket accommodation part at an upper portion of a sample chamber, wherein the column housing coupling part and the through-hole part and other portion out of the structure of the metal gasket of the vacuum isolation part are made as one body or integrally coupled each other, and wherein a difference of no less than $10^1$ torr in a vacuum degree is maintained between both sides of the device by selecting an appropriate diameter of a lens electrode layer, which is finally positioned in a path along which the electron beam is emitted, or using the through-hole part, wherein the column housing coupling part, the through-hole part, and the vacuum isolation part are formed monolithically.

2. The device according to claim 1, wherein the column housing and the device for sustaining different vacuum degrees are integrally formed with each other.

3. The device according to claim 1, wherein the column housing and the device for sustaining different vacuum degrees are coupled with each other using a rubber ring.

4. The device according to claim 1, wherein the device for sustaining different vacuum degrees can be attached to and detached from the column housing coupling part and the vacuum isolation part.

5. The device according to claim 1, wherein the through-hole part is formed in a membrane having a thickness of a thin micrometer level and functions to maintain different vacuum degrees.

6. The device according to claim 1, wherein at least two column housing coupling parts are provided so that at least two electron columns can be mounted.

7. An electron column system for sustaining a difference in a vacuum degree between an electron column chamber having an electron column and a column housing for securing the electron column and a sample chamber in which a sample is located, characterizing by comprising the device for sustaining different vacuum degrees according to claim 1.

8. The system according to claim 7, wherein the electron column chamber is placed in the sample chamber.

9. The system according to claim 7, wherein at least two column housing coupling parts are provided in the device for sustaining different vacuum degrees so that a plurality of electron columns, which correspond to respective column housing coupling parts, can be mounted.

10. The device according to claim 3, wherein the device for sustaining different vacuum degrees can be attached to and detached from the column housing coupling part and the vacuum isolation part.

11. The device according to claim 3, wherein the through-hole part comprises a membrane having a thickness of a thin micrometer level and functions to maintain different vacuum degrees.

12. The device according to claim 3, wherein at least two column housing coupling parts are provided so that at least two electron columns can be mounted.

13. The device according to claim 4, wherein the through-hole part comprises a membrane having a thickness of a thin micrometer level and functions to maintain different vacuum degrees.

14. The device according to claim 4, wherein at least two column housing coupling parts are provided so that at least two electron columns can be mounted.

15. The device according to claim 5, wherein at least two column housing coupling parts are provided so that at least two electron columns can be mounted.

16. The system according to claim 8, wherein at least two column housing coupling parts are provided in the device for sustaining different vacuum degrees so that a plurality of electron columns, which correspond to respective column housing coupling parts, can be mounted.

17. An electron column system for sustaining a difference in a vacuum degree between an electron column chamber receiving an electron column and a column housing for securing the electron column and a sample chamber in which a sample is located, characterizing by comprising the device for sustaining different vacuum degrees according to claim 3.

18. The system according to claim 16, wherein the electron column chamber is placed in the sample chamber.

19. The system according to claim 16, wherein at least two column housing coupling parts are provided in the device for sustaining different vacuum degrees so that a plurality of electron columns, which correspond to respective column housing coupling parts, can be mounted.

20. An electron column system for sustaining a difference in a vacuum degree between an electron column chamber receiving an electron column and a column housing for securing the electron column and a sample chamber in which a sample is located, characterizing by comprising the device for sustaining different vacuum degrees according to claim 4.

* * * * *